(12) United States Patent
Malhotra

(10) Patent No.: US 12,568,006 B2
(45) Date of Patent: Mar. 3, 2026

---

(54) METHOD AND APPARATUS FOR DIGITAL SIGNAL PROCESSING-BASED BASELINE WANDER CORRECTION

(71) Applicant: Samsung Electronics Co., Ltd., Gyeonggi-do (KR)

(72) Inventor: Gaurav Malhotra, Cupertino, CA (US)

(73) Assignee: Samsung Electronics Co., Ltd (KR)

( * ) Notice: Subject to any disclaimer, the term of this patent is extended or adjusted under 35 U.S.C. 154(b) by 36 days.

(21) Appl. No.: 18/517,461

(22) Filed: Nov. 22, 2023

(65) Prior Publication Data

US 2025/0132958 A1 Apr. 24, 2025

Related U.S. Application Data

(60) Provisional application No. 63/592,384, filed on Oct. 23, 2023.

(51) Int. Cl.
H04L 25/06 (2006.01)
H03M 1/12 (2006.01)

(52) U.S. Cl.
CPC .......... H04L 25/061 (2013.01); H03M 1/124 (2013.01)

(58) Field of Classification Search
CPC .............................. H04L 25/061; H03M 1/124
See application file for complete search history.

(56) References Cited

U.S. PATENT DOCUMENTS

| | | | |
|---|---|---|---|
| 6,618,436 B2 | 9/2003 | Greiss et al. | |
| 7,248,629 B2 | 7/2007 | Hatamian | |
| 7,738,567 B2 | 6/2010 | Miller et al. | |
| 8,514,922 B2 | 8/2013 | Li et al. | |
| 9,414,758 B1 * | 8/2016 | Brockway | ............ A61B 5/6804 |
| 11,502,880 B1 | 11/2022 | Bartling et al. | |
| 2003/0140075 A1 * | 7/2003 | Lis | ........................... H04B 3/23 |
| | | | 708/322 |

FOREIGN PATENT DOCUMENTS

KR 10-0400213 11/2023

* cited by examiner

*Primary Examiner* — Janice N Tieu
(74) *Attorney, Agent, or Firm* — The Farrell Law Firm, P.C.

(57) ABSTRACT

A method and an apparatus are provided in which an analog signal may be sampled by an analog-to-digital converter (ADC) to generate digital signal samples affected by baseline wander. Digital signal processing (DSP) may be performed on the digital signal samples to generate a recovered signal with corrected baseline wander. The DSP is performed using a first adaptable coefficient for a current digital signal sample and a second adaptable coefficient for a previous digital signal sample.

17 Claims, 5 Drawing Sheets

Sample analog signal by ADC to generate digital signal samples

502

Multiply digital signal sample by first adaptable coefficient

504

Multiply previous digital signal sample by second adaptable coefficient

506

Generate recovered signal sample from summation of first result, second result, and previous recovered signal sample

508

METHOD AND APPARATUS FOR DIGITAL SIGNAL PROCESSING-BASED BASELINE WANDER CORRECTION

CROSS-REFERENCE TO RELATED APPLICATION

This application claims the priority benefit under 35 U.S.C. § 119 (e) of U.S. Provisional Application No. 63/592, 384, filed on Oct. 23, 2023, the disclosure of which is incorporated by reference in its entirety as if fully set forth herein.

TECHNICAL FIELD

The disclosure generally relates to signal reception. More particularly, the subject matter disclosed herein relates to improvements to methods for correcting baseline wander in a received signal through digital signal processing (DSP).

SUMMARY

In wired network communications, a transmitter may convert and encode input data for transmission over a channel, and a receiver is optimized to receive the transmitted signal and decode it to generate output data. Due to differing electrical operating parameters of devices, communication networks may have links that are alternating current (AC) coupled using high-pass filters. The high-pass filters, which may include a series of capacitors, may remove the low frequency components of the transmitted signals, resulting in baseline wander or direct current (DC) droop of the received data voltage. Specifically, the high-pass filter may have low cutoff frequencies, which may prevent most frequencies less than 4 kHz from passing through to the receiver circuit. This may eliminate the DC component of the incoming waveform and may cause a long pulse to drift toward a common mode voltage of the signals transmitted on the channel.

Accordingly, transmitted pulses may be distorted by a droop effect due to the high pass filter in the signal path. In long strings of identical symbols, the droop may become severe enough to result in erroneous sampled values for affected pulses.

To solve this problem, baseline correction or DC droop control may be performed by introducing transitions at regular intervals. DC droop may be estimated and corrected in analog, which does not need to be fed back via a digital-to-analog converter (DAC), and which may be relevant for slow signal processing (e.g., electrocardiogram (ECG) signals). A finite impulse response (FIR) filter may be used because an infinite impulse response (IIR) filter may not be easily implemented in analog, and computations may be utilized that are relevant to the FIR filters.

One issue with above approach is that this may reduce an effective data rate and may only be effective up to a limited frequency.

To overcome this issue, systems and methods are described herein for baseline wander correction via DSP. This approach improves on previous methods because it is not necessary to add extra bits, thereby maintaining the same data rate. Additionally, the baseline correction is based on adaptive algorithms that may compensate up to any level of imbalance, and are not dependent on a lower 3 dB frequency.

In an embodiment, a method is provided in which an analog signal may be sampled by an analog-to-digital converter (ADC) to generate digital signal samples affected by baseline wander. DSP may be performed on the digital signal samples to generate a recovered signal with corrected baseline wander. The DSP is performed using a first adaptable coefficient for a current digital signal sample and a second adaptable coefficient for a previous digital signal sample.

In an embodiment, an apparatus is provided having an ADC configured to sample an analog signal to generate digital signal samples affected by baseline wander. The apparatus also includes a baseline wander correction circuit configured to perform DSP on the digital signal samples to generate a recovered signal with corrected baseline wander. The DSP is performed using a first adaptable coefficient for a current digital signal sample and a second adaptable coefficient for a previous digital signal sample.

In an embodiment, an apparatus is provided that includes a processor and a non-transitory computer readable storage medium storing instructions. When executed, the instructions cause the processor to sample an analog signal, at an ADC to generate digital signal samples affected by baseline wander, and perform DSP on the digital signal samples to generate a recovered signal with corrected baseline wander. The DSP is performed, per sample, using a first adaptable coefficient for a current digital signal sample and a second adaptable coefficient for a previous digital signal sample.

BRIEF DESCRIPTION OF THE DRAWING

In the following section, the aspects of the subject matter disclosed herein will be described with reference to exemplary embodiments illustrated in the figures, in which.

DETAILED DESCRIPTION

Figure 1:
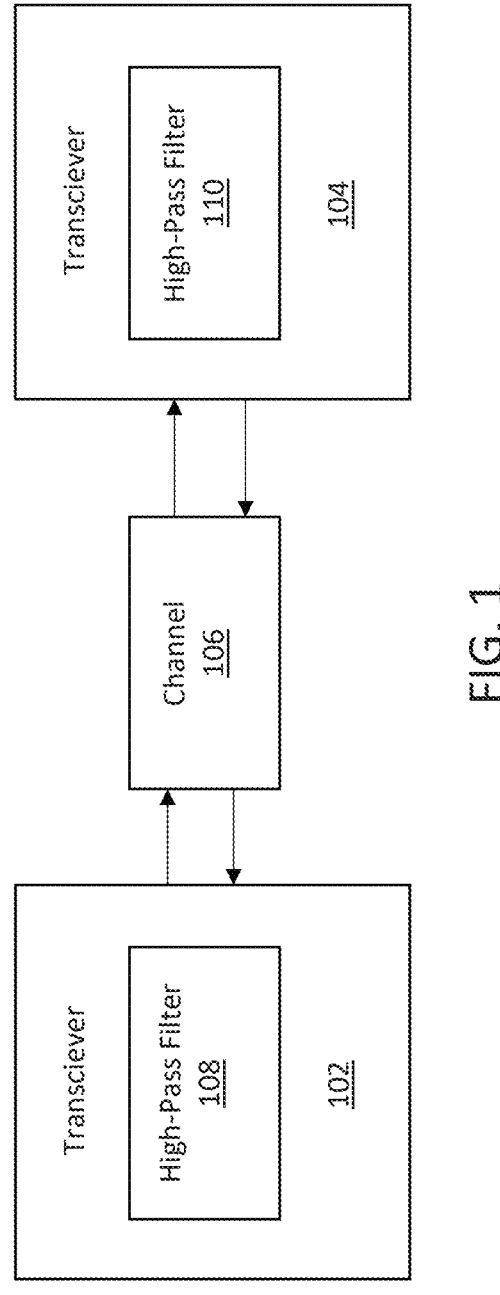
FIG. 1 is a diagram illustrating a communications link, according to an embodiment.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail to not obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not necessarily all be referring to the same embodiment. Furthermore, the particular features, structures or characteristics may be combined in any suitable manner in one or more embodiments. In this regard, as used herein, the word "exemplary"

means "serving as an example, instance, or illustration." Any embodiment described herein as "exemplary" is not to be construed as necessarily preferred or advantageous over other embodiments. Additionally, the particular features, structures, or characteristics may be combined in any suitable manner in one or more embodiments. Also, depending on the context of discussion herein, a singular term may include the corresponding plural forms and a plural term may include the corresponding singular form. Similarly, a hyphenated term (e.g., "two-dimensional," "pre-determined," "pixel-specific," etc.) may be occasionally interchangeably used with a corresponding non-hyphenated version (e.g., "two dimensional," "predetermined," "pixel specific," etc.), and a capitalized entry (e.g., "Counter Clock," "Row Select," "PIXOUT," etc.) may be interchangeably used with a corresponding non-capitalized version (e.g., "counter clock," "row select," "pixout," etc.). Such occasional interchangeable uses shall not be considered inconsistent with each other.

Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing some example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "module" refers to any combination of software, firmware and/or hardware configured to provide the functionality described herein in connection with a module. For example, software may be embodied as a software package, code and/or instruction set or instructions, and the term "hardware," as used in any implementation described herein, may include, for example, singly or in any combination, an assembly, hardwired circuitry, programmable circuitry, state machine circuitry, and/or firmware that stores instructions executed by programmable circuitry. The modules may, collectively or individually, be embodied as circuitry that forms part of a larger system, for example, but not limited to, an integrated circuit (IC), system on-a-chip (SoC), an assembly, and so forth.

FIG. 1 is a diagram illustrating a communications link, according to an embodiment. A first transceiver 102 and a second transceiver 104 may be connected by a channel 106. The first transceiver 102 may include a transmitter and a receiver, as well as at least one high-pass filter 108. The second transceiver 104 may include a transmitter and a receiver, as well as at least one high-pass filter 110. For both the first transceiver 102 and the second transceiver 104, each of the transmitter and the receiver may include a respective high-pass filter, or a single high-pass filter may be used for both the transmitter and the receiver. Each transmitter may be configured to convert and encode input data for transmission over the channel 106. And each receiver may be configured to receive and decode the transmitted signal to generate output data.

Figure 2:
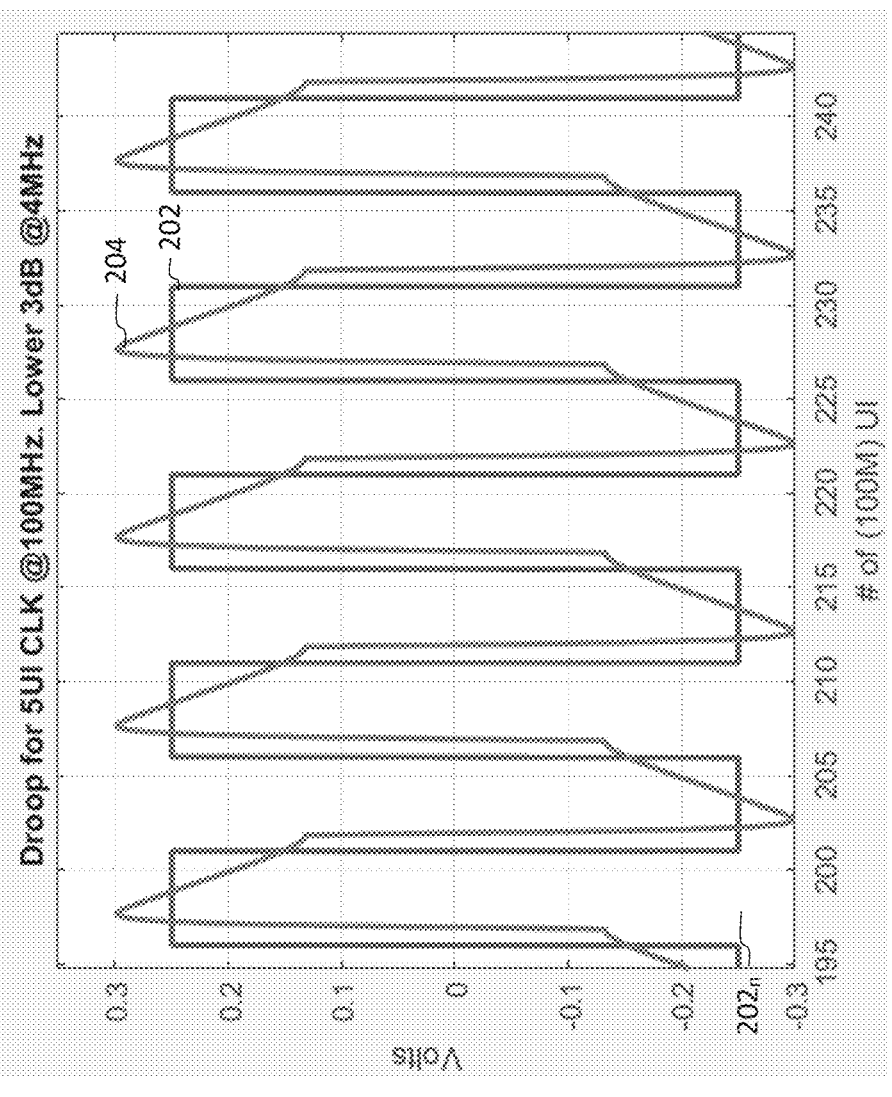
FIG. 2 is a diagram illustrating the effect of baseline wander on a pulse amplitude modulation symbol, according to an embodiment.

FIG. 2 is a diagram illustrating the effect of baseline wander on a pulse amplitude modulation symbol, according to an embodiment. Transmitted rectangular pulses 202 are distorted by a droop effect, resulting in a signal affected by baseline wander. Baseline wander may be caused by removal of DC in a communicated signal due to capacitors in the communication path. The capacitors may be disposed in the communication path for isolation, and are therefore necessary, or by design to filter out low frequency noise (e.g., high-pass filters). As shown in FIG. 2, for a 5 user interface (UI) clock (CLK) at 100 MHz, with a lower 3 dB at 4 MHz, the rectangular pulse 202 having a high value of approximately 0.25 V is distorted to a signal 204 having a high that droops from approximately 0.3 V to 0.13 V. Further, the rectangular pulse 202 having a low value of approximately –0.25 is distorted to the signal 204 having a low that wanders from approximately –0.3 V to –0.13 V.

Embodiments provide a baseline wander canceller for restoring the original signal by correcting for it via DSP. At a receiver, after a received signal is sampled by an ADC, samples may be processed by a block that corrects for baseline wander. A two-tap filter (e.g., having two multipliers and two adders) may be used for this purpose. Coefficients (e.g., multiplier values) of the filter may adapt to any magnitude of baseline wander. Baseline wander may be caused by the removal of DC in the signal, created either by capacitors in the path which are put there for isolation (hence necessary) or by design to filter out low frequency noise. The goal of the baseline wander canceller is to restore the original signal.

Figure 3:
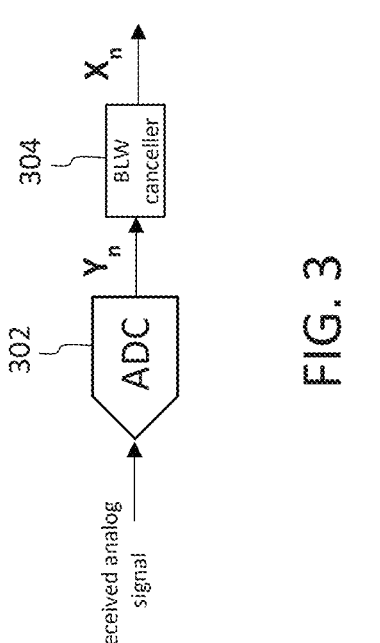
FIG. 3 is a diagram illustrating a receiver with baseline wander correction, according to an embodiment.

FIG. 3 is a diagram illustrating a receiver with baseline wander correction, according to an embodiment. An incoming analog signal may be sampled by an ADC 302. A digital signal $Y_n$ affected by baseline wander may be output from the ADC 302 and provided to a baseline wander canceller 304, which is a DSP block. The baseline wander canceller 304 outputs a recovered signal $X_n$.

Figure 4:
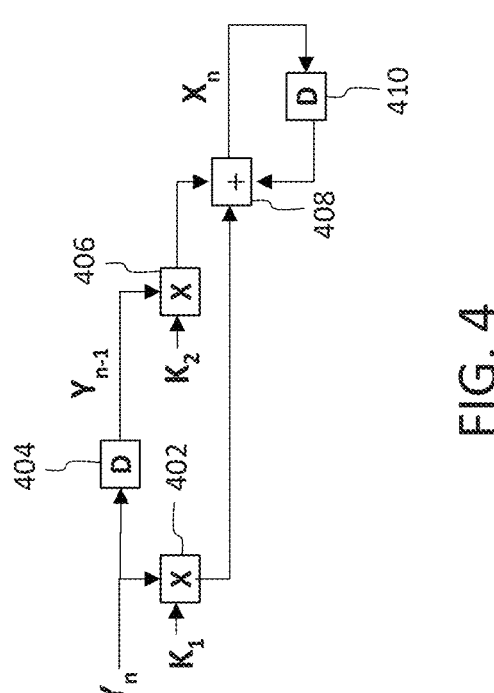
FIG. 4 is a diagram illustrating operation of the baseline wander canceller in a receiver, according to an embodiment.

FIG. 4 is a diagram illustrating operation of the baseline wander canceller in a receiver, according to an embodiment. Operation of the baseline wander canceller is performed in accordance with Equation (1) below:

$$X_n = X_{n-1} + K_1 * Y_n + K_2 * Y_{n-1} \tag{1}$$

where $Y_n$ is the original digital signal affected by baseline wander and input to the baseline wander canceller; $X_n$ is the recovered signal output from the baseline wander canceller; K1 and K2 are coefficients of the baseline wander canceller; and D is a delay of one sample.

The original digital signal $Y_n$, which is affected by baseline wander and output from the ADC, may be multiplied by the first coefficient K1 at a first multiplier block 402. The original digital signal $Y_n$ may also be delayed by one sample at a first delay block 404, which outputs delayed digital signal $Y_{n-1}$. The delayed digital signal $Y_{n-1}$ may be multiplied by the second coefficient K2 at a second multiplier block 406. Output from the first multiplier block 402 and output from the second multiplier block 406 may be summed with a delayed recovered signal $X_{n-1}$ at a summation block 408, which outputs a recovered signal $X_n$ with the baseline wander corrected. The recovered signal $X_n$ is delayed at a second delay block 410, which outputs that delayed recovered signal $X_{n-1}$ that is input to the summation block 408 for use in a subsequent iteration.

K1 and K2 coefficients may be adapted using a least mean squares (LMS) algorithm, based on Equations (2) and (3) below.

$$K1 = K1 + mu * e_n * d_n \tag{2}$$

$$K2 = K2 + mu * e_n * d_{n-1} \tag{3}$$

where $e_n$ is an error or a difference between a desired signal d and the recovered signal $X_n$; and mu is a small number that may be implemented via a right shift of bits (i.e. $mu = 2^{-N}$, N=0:10). The error may be minimized via this LMS adaptation.

In order to obtain the desired signal d, the sign of the ADC output $Y_n$ may be used as set forth in Equation (4) below.

$$\text{if } Y_n > 0, d_n = 1; \tag{4}$$

$$\text{else if } Y_n <= 0, d_n = -1$$

According to another embodiment, in order to obtain the desired signal d, all bits of the ADC output $Y_n$ may be used as set forth in Equation (5) below.

$$d_n = Y_n \tag{5}$$

According to another embodiment, in order to obtain the desired signal d, some most significant bits (MSBs) of the ADC output $Y_n$ may be used, as set forth below in Equation (6), which is the same as a slicer operation, and is useful for non-binary signals.

$$d_n = MSB \ 1 \text{ to } N \text{ of } (Y_n); \tag{6}$$

$$\text{where } N = 2: ADC_{max}$$

An initial value of K1 may be set to 1, and an initial value of K2 may be set to −1. These initial values may result in faster convergence. However, in another embodiment, K1 and K2 may both be initially set to 0.

To simplify the digital logic, sign-sign LMS can be used, by using only the sign of error $e_n$ and the sign of the ADC output $Y_n$. Specifically, the K1 and K2 coefficients may be adapted using sign-sign LMS, as set forth in Equations (7) and (8) below.

$$K1 = K1 + mu * \text{sign}(e_n) * \text{sign}(d_n) \tag{7}$$

$$K2 = K2 + mu * \text{sign}(e_n) * \text{sign}(d_{n-1}) \tag{8}$$

In a fixed point implementation, the IIR (feedback) filter may become unstable due to coefficient quantization. To avoid instability, a variation to Equation (1) is set forth below in Equation (9)

$$X_n = \alpha X_{n-1} + K1 * Y_n + K2 * Y_{n-1} \tag{9}$$

where $\alpha$ is a number close to but smaller than 1 (e.g., 0.95).

Figure 5:
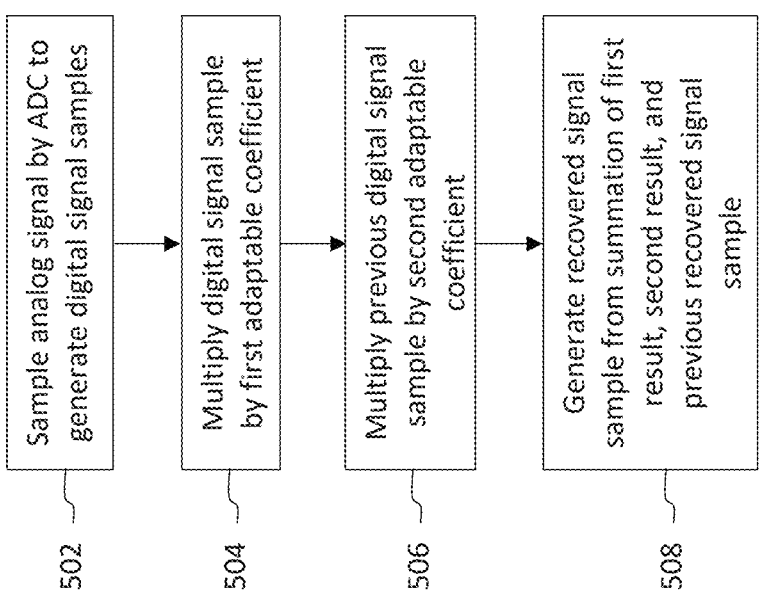
FIG. 5 is a flowchart illustrating method for correcting baseline wander in a received signal, according to an embodiment.

FIG. 5 is a diagram illustrating method for cancelling baseline wander in a received signal, according to an embodiment. At 502, an analog signal is sampled by an ADC to generate digital signal samples affected by baseline wander.

At 504, a current digital signal sample may be multiplied by a first adaptable coefficient to generate a first result. The first adaptable coefficient may have an initial value of 1. The first adaptable coefficient may be determined using an LMS algorithm based on a sample error and a desired signal sample. The first adaptable coefficient may be adapted from a previously determined first adaptable coefficient by adding a multiplied result of the sample error, the desired signal sample, and a value implemented via a right shift of bits. The first adaptable coefficient may be adapted from a previously determined first adaptable coefficient by adding a multiplied result of a first sign of the sample error, a second sign of the desired signal sample, and a value implemented via a right shift of bits. The sample error may be a difference between the desired signal sample and the recovered signal sample. The desired signal sample may be based on a sign of the current digital signal sample, all bits of the current digital signal sample, or a number of MSBs of the current digital signal sample.

At 506, a previous digital signal sample is multiplied by a second adaptable coefficient to generate a second result. The second adaptable coefficient may have an initial value of −1. The second adaptable coefficient may be determined using an LMS algorithm based on a sample error and a desired signal sample. The second adaptable coefficient may be adapted from a previously determined second adaptable coefficient by adding a multiplied result of the sample error, the desired signal sample, and a value implemented via a right shift of bits. The second adaptable coefficient may be adapted from a previously determined second adaptable coefficient by adding a multiplied result of a first sign of the sample error, a second sign of the desired signal sample, and a value implemented via a right shift of bits.

At 508, the first result, the second result, and a third result corresponding to a previous recovered signal sample are summed to generate a recovered signal sample. The previous recovered signal sample may be multiplied by a number less than 1 to determine the third result.

Figure 6:
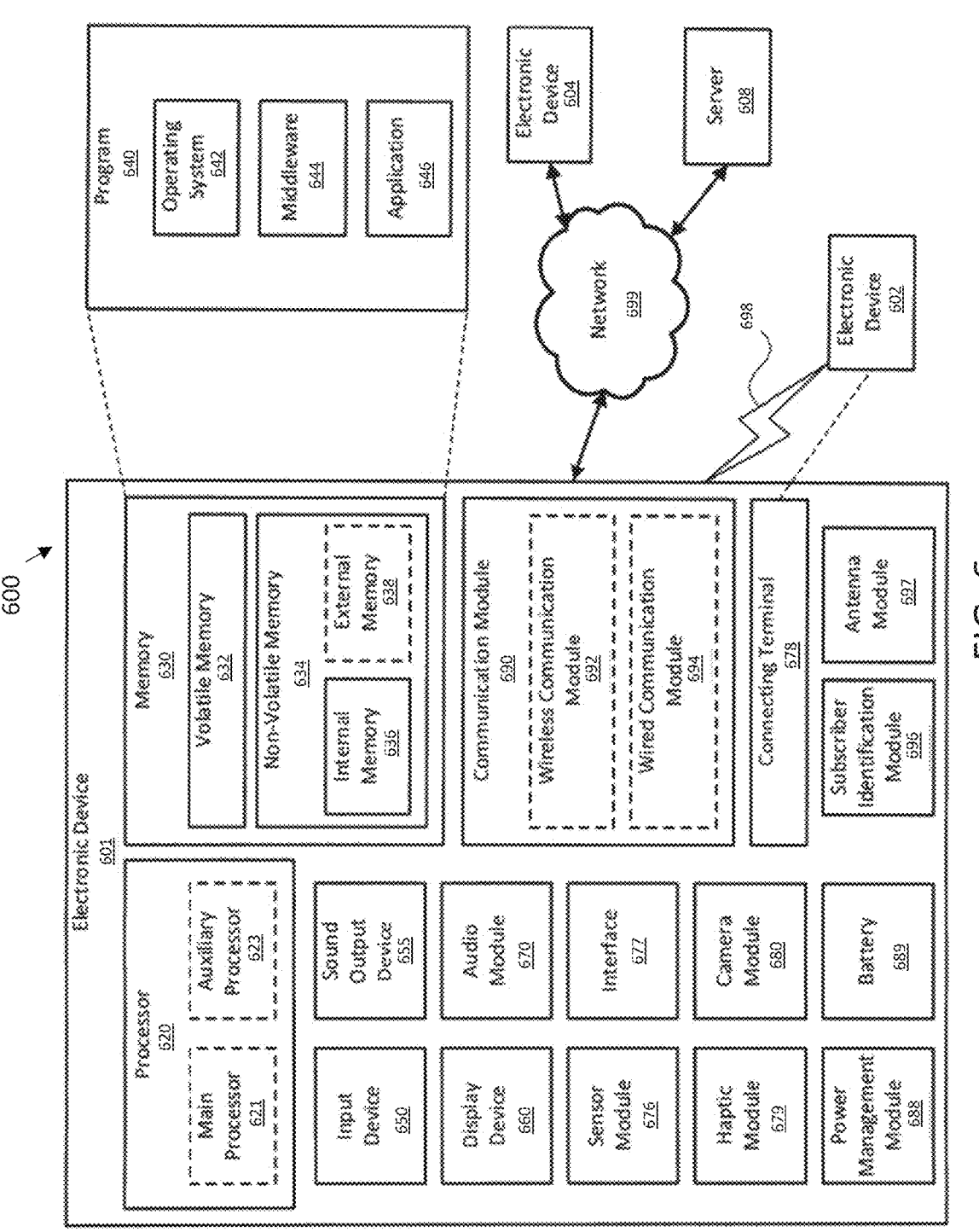
FIG. 6 is a block diagram of an electronic device in a network environment, according to an embodiment.

FIG. 6 is a block diagram of an electronic device in a network environment 600, according to an embodiment.

Referring to FIG. 6, an electronic device 601 in a network environment 600 may communicate with an electronic device 602 via a first network 698 (e.g., a short-range wireless communication network), or an electronic device 604 or a server 608 via a second network 699 (e.g., a long-range wireless communication network). The electronic device 601 may communicate with the electronic device 604 via the server 608. The electronic device 601 may include a processor 620, a memory 630, an input device 650, a sound output device 655, a display device 660, an audio module 670, a sensor module 676, an interface 677, a haptic module 679, a camera module 680, a power management module 688, a battery 689, a communication module 690, a subscriber identification module (SIM) card 696, or an antenna module 697. In one embodiment, at least one (e.g., the display device 660 or the camera module 680) of the components may be omitted from the electronic device 601, or one or more other components may be added to the electronic device 601. Some of the components may be implemented as a single integrated circuit (IC). For example, the sensor module 676 (e.g., a fingerprint sensor, an iris sensor, or an illuminance sensor) may be embedded in the display device 660 (e.g., a display).

The processor 620 may execute software (e.g., a program 640) to control at least one other component (e.g., a hardware or a software component) of the electronic device 601 coupled with the processor 620 and may perform various data processing or computations.

As at least part of the data processing or computations, the processor 620 may load a command or data received from another component (e.g., the sensor module 676 or the communication module 690) in volatile memory 632, process the command or the data stored in the volatile memory 632, and store resulting data in non-volatile memory 634. The processor 620 may include a main processor 621 (e.g., a central processing unit (CPU) or an application processor (AP)), and an auxiliary processor 623 (e.g., a graphics processing unit (GPU), an image signal processor (ISP), a sensor hub processor, or a communication processor (CP)) that is operable independently from, or in conjunction with, the main processor 621. Additionally or alternatively, the auxiliary processor 623 may be adapted to consume less power than the main processor 621, or execute a particular function. The auxiliary processor 623 may be implemented as being separate from, or a part of, the main processor 621.

The auxiliary processor 623 may control at least some of the functions or states related to at least one component (e.g., the display device 660, the sensor module 676, or the communication module 690) among the components of the electronic device 601, instead of the main processor 621 while the main processor 621 is in an inactive (e.g., sleep) state, or together with the main processor 621 while the main processor 621 is in an active state (e.g., executing an application). The auxiliary processor 623 (e.g., an image signal processor or a communication processor) may be implemented as part of another component (e.g., the camera module 680 or the communication module 690) functionally related to the auxiliary processor 623.

The memory 630 may store various data used by at least one component (e.g., the processor 620 or the sensor module 676) of the electronic device 601. The various data may include, for example, software (e.g., the program 640) and input data or output data for a command related thereto. The memory 630 may include the volatile memory 632 or the non-volatile memory 634. Non-volatile memory 634 may include internal memory 636 and/or external memory 638.

The program 640 may be stored in the memory 630 as software, and may include, for example, an operating system (OS) 642, middleware 644, or an application 646.

The input device 650 may receive a command or data to be used by another component (e.g., the processor 620) of the electronic device 601, from the outside (e.g., a user) of the electronic device 601. The input device 650 may include, for example, a microphone, a mouse, or a keyboard.

The sound output device 655 may output sound signals to the outside of the electronic device 601. The sound output device 655 may include, for example, a speaker or a receiver. The speaker may be used for general purposes, such as playing multimedia or recording, and the receiver may be used for receiving an incoming call. The receiver may be implemented as being separate from, or a part of, the speaker.

The display device 660 may visually provide information to the outside (e.g., a user) of the electronic device 601. The display device 660 may include, for example, a display, a hologram device, or a projector and control circuitry to control a corresponding one of the display, hologram device, and projector. The display device 660 may include touch circuitry adapted to detect a touch, or sensor circuitry (e.g., a pressure sensor) adapted to measure the intensity of force incurred by the touch.

The audio module 670 may convert a sound into an electrical signal and vice versa. The audio module 670 may obtain the sound via the input device 650 or output the sound via the sound output device 655 or a headphone of an external electronic device 602 directly (e.g., wired) or wirelessly coupled with the electronic device 601.

The sensor module 676 may detect an operational state (e.g., power or temperature) of the electronic device 601 or an environmental state (e.g., a state of a user) external to the electronic device 601, and then generate an electrical signal or data value corresponding to the detected state. The sensor module 676 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 677 may support one or more specified protocols to be used for the electronic device 601 to be coupled with the external electronic device 602 directly (e.g., wired) or wirelessly. The interface 677 may include, for example, a high-definition multimedia interface (HDMI), a universal serial bus (USB) interface, a secure digital (SD) card interface, or an audio interface.

A connecting terminal 678 may include a connector via which the electronic device 601 may be physically connected with the external electronic device 602. The connecting terminal 678 may include, for example, an HDMI connector, a USB connector, an SD card connector, or an audio connector (e.g., a headphone connector).

The haptic module 679 may convert an electrical signal into a mechanical stimulus (e.g., a vibration or a movement) or an electrical stimulus which may be recognized by a user via tactile sensation or kinesthetic sensation. The haptic module 679 may include, for example, a motor, a piezoelectric element, or an electrical stimulator.

The camera module 680 may capture a still image or moving images. The camera module 680 may include one or more lenses, image sensors, image signal processors, or flashes. The power management module 688 may manage power supplied to the electronic device 601. The power management module 688 may be implemented as at least part of, for example, a power management integrated circuit (PMIC).

The battery 689 may supply power to at least one component of the electronic device 601. The battery 689 may include, for example, a primary cell which is not rechargeable, a secondary cell which is rechargeable, or a fuel cell.

The communication module 690 may support establishing a direct (e.g., wired) communication channel or a wireless communication channel between the electronic device 601 and the external electronic device (e.g., the electronic device 602, the electronic device 604, or the server 608) and performing communication via the established communication channel. The communication module 690 may include one or more communication processors that are operable independently from the processor 620 (e.g., the AP) and supports a direct (e.g., wired) communication or a wireless communication. The communication module 690 may include a wireless communication module 692 (e.g., a cellular communication module, a short-range wireless communication module, or a global navigation satellite system (GNSS) communication module) or a wired communication module 694 (e.g., a local area network (LAN) communication module or a power line communication (PLC) module). A corresponding one of these communication modules may communicate with the external electronic device via the first network 698 (e.g., a short-range communication network, such as BLUETOOTH™, wireless-fidelity (Wi-Fi) direct, or a standard of the Infrared Data Association (IrDA)) or the second network 699 (e.g., a long-range communication network, such as a cellular network, the Internet, or a computer network (e.g., LAN or wide area network (WAN)). These various types of communication modules may be implemented as a single component (e.g., a single IC), or may be implemented as multiple components (e.g., multiple ICs) that are separate from each other. The wireless communication module 692 may identify and authenticate the electronic device 601 in a communication network, such as the first network 698 or the second network 699, using subscriber information (e.g., international mobile subscriber identity (IMSI)) stored in the subscriber identification module 696.

The communication module 690 may include a transceiver, having an ADC and baseline wander canceller, as shown and described with respect to FIGS. 1 and 3.

The antenna module 697 may transmit or receive a signal or power to or from the outside (e.g., the external electronic device) of the electronic device 601. The antenna module 697 may include one or more antennas, and, therefrom, at least one antenna appropriate for a communication scheme used in the communication network, such as the first network 698 or the second network 699, may be selected, for example, by the communication module 690 (e.g., the wireless communication module 692). The signal or the power may then be transmitted or received between the communication module 690 and the external electronic device via the selected at least one antenna.

Commands or data may be transmitted or received between the electronic device 601 and the external electronic device 604 via the server 608 coupled with the second network 699. Each of the electronic devices 602 and 604 may be a device of a same type as, or a different type, from the electronic device 601. All or some of operations to be executed at the electronic device 601 may be executed at one or more of the external electronic devices 602, 604, or 608. For example, if the electronic device 601 should perform a function or a service automatically, or in response to a request from a user or another device, the electronic device 601, instead of, or in addition to, executing the function or the service, may request the one or more external electronic devices to perform at least part of the function or the service. The one or more external electronic devices receiving the request may perform the at least part of the function or the service requested, or an additional function or an additional service related to the request and transfer an outcome of the performing to the electronic device 601. The electronic device 601 may provide the outcome, with or without further processing of the outcome, as at least part of a reply to the request. To that end, a cloud computing, distributed computing, or client-server computing technology may be used, for example.

Embodiments of the subject matter and the operations described in this specification may be implemented in digital electronic circuitry, or in computer software, firmware, or hardware, including the structures disclosed in this specification and their structural equivalents, or in combinations of one or more of them. Embodiments of the subject matter described in this specification may be implemented as one or more computer programs, i.e., one or more modules of computer-program instructions, encoded on computer-storage medium for execution by, or to control the operation of data-processing apparatus. Alternatively or additionally, the program instructions can be encoded on an artificially-generated propagated signal, e.g., a machine-generated electrical, optical, or electromagnetic signal, which is generated to encode information for transmission to suitable receiver apparatus for execution by a data processing apparatus. A computer-storage medium can be, or be included in, a computer-readable storage device, a computer-readable storage substrate, a random or serial-access memory array or device, or a combination thereof. Moreover, while a computer-storage medium is not a propagated signal, a computer-storage medium may be a source or destination of computer-program instructions encoded in an artificially-generated propagated signal. The computer-storage medium can also be, or be included in, one or more separate physical components or media (e.g., multiple CDs, disks, or other storage devices). Additionally, the operations described in this specification may be implemented as operations performed by a data-processing apparatus on data stored on one or more computer-readable storage devices or received from other sources.

While this specification may contain many specific implementation details, the implementation details should not be construed as limitations on the scope of any claimed subject matter, but rather be construed as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described herein. Other embodiments are within the scope of the following claims. In some cases, the actions set forth in the claims may be performed in a different order and still achieve desirable results. Additionally, the processes depicted in the accompanying figures do not necessarily require the particular order shown, or sequential order, to achieve desirable results. In certain implementations, multitasking and parallel processing may be advantageous.

As will be recognized by those skilled in the art, the innovative concepts described herein may be modified and varied over a wide range of applications. Accordingly, the scope of claimed subject matter should not be limited to any of the specific exemplary teachings discussed above, but is instead defined by the following claims.

What is claimed is:

1. A method comprising:

sampling an analog signal by an analog-to-digital converter (ADC) to generate digital signal samples affected by baseline wander; and performing digital signal processing (DSP) on the digital signal samples to generate a recovered signal with corrected baseline wander, wherein the DSP is performed using a first adaptable coefficient for a current digital signal sample and a second adaptable coefficient for a previous digital signal sample, wherein performing the DSP comprises:

multiplying the current digital signal sample by the first adaptable coefficient to generate a first result;

multiplying the previous digital signal sample by the second adaptable coefficient to generate a second result; and summing the first result, the second result, and a third result, wherein the third result is based on a previously recovered signal sample produced by the DSP and fed back into the summation, to generate a current recovered signal sample.

2. The method of claim 1, further comprising multiplying the previous recovered signal sample by a number less than 1.

3. The method of claim 1, wherein the first adaptable coefficient has an initial value of 1 and the second adaptable coefficient has an initial value of −1.

4. The method of claim 1, wherein the first adaptable coefficient and the second adaptable coefficient are determined using a least mean squares algorithm based on a sample error and a desired signal sample.

5. The method of claim 4, wherein the first adaptable coefficient and the second adaptable coefficient are adapted from respective previously determined coefficients by adding a multiplied result of the sample error, the desired signal sample, and a value implemented via a right shift of bits.

6. The method of claim 4, wherein the first adaptable coefficient and the second adaptable coefficient are adapted from respective previously determined coefficients by adding a multiplied result of a first sign of the sample error, a second sign of the desired signal sample, and a value implemented via a right shift of bits.

7. The method of claim 4, wherein the sample error is a difference between the desired signal sample and the recovered signal sample.

8. The method of claim 4, wherein the desired signal sample is based on a sign of the current digital signal sample, all bits of the current digital signal sample, or a number of most significant bits of the current digital signal sample.

9. An apparatus comprising:

an analog-to-digital converter (ADC) configured to sample an analog signal to generate digital signal samples affected by baseline wander; and a baseline wander correction circuit configured to perform digital signal processing (DSP) on the digital signal samples to generate a recovered signal with corrected baseline wander, wherein the DSP is performed using a first adaptable coefficient for a current digital signal sample and a second adaptable coefficient for a previous digital signal sample, wherein the baseline wander correction circuit is further configured to:

multiply the current digital signal sample by the first adaptable coefficient to generate a first result;

multiply the previous digital signal sample by the second adaptable coefficient to generate a second result; and sum the first result, the second result, and a third result, wherein the third result is based on a previously recovered signal sample produced by the DSP and fed back into the summation, to generate a recovered signal sample.

10. The apparatus of claim 9, wherein the baseline wander correction circuit is further configured to multiply the previous recovered signal sample by a number less than 1.

11. The apparatus of claim 9, wherein the first adaptable coefficient has an initial value of 1 and the second adaptable coefficient has an initial value of −1.

12. The apparatus of claim 9, wherein the baseline wander correction circuit is further configured to determine the first adaptable coefficient and the second adaptable coefficient using a least means squares algorithm based on a sample error and a desired signal sample.

13. The apparatus of claim 12, wherein the baseline wander correction circuit is further configured to adapt the first adaptable coefficient and the second adaptable coefficient from respective previously determined coefficients by adding a multiplied result of the sample error, the desired signal sample, and a value implemented via a right shift of bits.

14. The apparatus of claim 12, wherein the baseline wander correction circuit is further configured to adapt the first adaptable coefficient and the second adaptable coefficient from respective previously determined coefficients by adding a multiplied result of a first sign of the sample error, a second sign of the desired signal sample, and a value implemented via a right shift of bits.

15. The apparatus of claim 12, wherein the sample error is a difference between the desired signal sample and the recovered signal sample.

16. The apparatus of claim 12, wherein the desired signal sample is based on a sign of the current digital signal sample, all bits of the current digital signal sample, or a number of most significant bits of the current digital signal sample.

17. An apparatus comprising:

a processor; and a non-transitory computer readable storing instructions that, when executed, cause the processor to:

sample an analog signal, at an analog-to-digital converter (ADC), to generate a digital signal samples affected by baseline wander; and perform digital signal processing (DSP) on the digital signal samples to generate a recovered signal with corrected baseline wander, wherein the DSP is performed, per sample, using a first adaptable coefficient for a current digital signal sample and a second adaptable coefficient for a previous digital signal sample, wherein, in performing the DSP, the instructions further cause the processor to:

multiply the current digital signal sample by the first adaptable coefficient to generate a first result;

multiply the previous digital signal sample by the second adaptable coefficient to generate a second result; and sum the first result, the second result, and a third result, wherein the third result is based on a previously recovered signal sample produced by the DSP and fed back into the summation, to generate a recovered signal sample.

* * * * *